United States Patent
Childress et al.

(10) Patent No.: US 12,320,873 B2
(45) Date of Patent: Jun. 3, 2025

(54) MAGNETORESISTIVE ELEMENT FOR SENSING A MAGNETIC FIELD IN A Z-AXIS

(71) Applicant: Allegro MicroSystems, LLC, Manchester, NH (US)

(72) Inventors: Jeffrey Childress, San Jose, CA (US); Nikita Strelkov, Meylan (FR)

(73) Assignee: Allegro MicroSystems, LLC, Manchester, NH (US)

( * ) Notice: Subject to any disclaimer, the term of this patent is extended or adjusted under 35 U.S.C. 154(b) by 245 days.

(21) Appl. No.: 18/256,494

(22) PCT Filed: Dec. 9, 2021

(86) PCT No.: PCT/IB2021/061484
§ 371 (c)(1),
(2) Date: Jun. 8, 2023

(87) PCT Pub. No.: WO2022/123472
PCT Pub. Date: Jun. 16, 2022

(65) Prior Publication Data
US 2024/0027551 A1    Jan. 25, 2024

(30) Foreign Application Priority Data

Dec. 11, 2020   (EP) ...................................... 20315489

(51) Int. Cl.
*G01R 33/09*    (2006.01)
(52) U.S. Cl.
CPC .................................. *G01R 33/098* (2013.01)
(58) Field of Classification Search
CPC .............. G01R 33/098; G01R 33/0206; H01F 10/3254; H01F 10/3272; H01F 10/3286; H01F 10/002; H01F 10/14; H01F 10/16
See application file for complete search history.

(56) References Cited

U.S. PATENT DOCUMENTS

| | | |
|---|---|---|
| 7,898,833 B2 | 3/2011 | Prejbeanu et al. |
| 8,120,003 B2 | 2/2012 | Wunnicke |
| 8,273,582 B2 | 9/2012 | Nozieres et al. |
| 8,409,880 B2 | 4/2013 | Nozieres et al. |
| 8,514,618 B2 | 8/2013 | Lombard et al. |
| 8,652,856 B2 | 2/2014 | Nozieres et al. |

(Continued)

FOREIGN PATENT DOCUMENTS

| | | |
|---|---|---|
| EP | 3726237 A2 | 10/2020 |
| WO | 2013180277 A1 | 12/2013 |

OTHER PUBLICATIONS

International Search Report issued in Application No. PCT/IB2021/061484 dated Feb. 23, 2022.

(Continued)

*Primary Examiner* — Alvaro E Fortich
(74) *Attorney, Agent, or Firm* — DALY, CROWLEY, MOFFORD & DURKEE, LLP (57) ABSTRACT

Magnetoresistive element including a reference layer having a fixed reference magnetization, a sense layer having a free sense magnetization and a tunnel barrier layer between the reference layer and the sense layer; the magnetoresistive element being configured to measure an external magnetic field oriented substantially perpendicular to the plane of the layers. The reference magnetization being oriented substantially perpendicular to the plane of the reference layer. The sense magnetization including a vortex configuration in the absence of an external magnetic field, the vortex configuration being substantially parallel to the plane of the sense layer and having a vortex core magnetization along an out-of-plane axis substantially perpendicular to the plane of the sense layer.

20 Claims, 7 Drawing Sheets

(56) References Cited

U.S. PATENT DOCUMENTS

| | | | |
|---|---|---|---|
| 9,324,936 | B2 | 4/2016 | Prejbeanu et al. |
| 9,583,695 | B2 | 2/2017 | Prejbeanu et al. |
| 9,886,989 | B2 | 2/2018 | Ducruet et al. |
| 10,050,193 | B1 | 8/2018 | Klebanov et al. |
| 10,593,869 | B2 | 3/2020 | Wong et al. |
| 10,605,874 | B2 | 3/2020 | Lassalle-Balier et al. |
| 11,719,527 | B2 | 8/2023 | Lassalle-Balier |
| 11,852,700 | B2 | 12/2023 | Dounia et al. |
| 11,860,250 | B2 | 1/2024 | Timopheev |
| 11,906,553 | B2 | 2/2024 | Timopheev |
| 2008/0068007 | A1* | 3/2008 | Hoshiya ............ G01D 5/145 |
| 2009/0189601 | A1* | 7/2009 | Okada ............... G01D 5/145 |
| | | | 324/207.21 |
| 2010/0320550 | A1* | 12/2010 | Abraham ......... G11C 11/1673 |
| | | | 257/E29.323 |
| 2011/0102939 | A1 | 5/2011 | Kawakami et al. |
| 2012/0206137 | A1 | 8/2012 | Cai et al. |
| 2013/0168787 | A1 | 7/2013 | Shen |
| 2015/0200355 | A1 | 7/2015 | Erie et al. |
| 2017/0330070 | A1* | 11/2017 | Sengupta ............ G06N 3/04 |
| 2020/0333407 | A1* | 10/2020 | Reimann ........... G01R 33/022 |
| 2022/0308133 | A1 | 9/2022 | Cuchet et al. |
| 2023/0332878 | A1 | 10/2023 | Lassalle-Balier et al. |
| 2023/0400537 | A1 | 12/2023 | Lassalle-Balier et al. |
| 2023/0413679 | A1 | 12/2023 | Chetlur et al. |
| 2024/0027551 | A1 | 1/2024 | Childress et al. |
| 2024/0074322 | A1 | 2/2024 | Klebanov et al. |
| 2024/0168108 | A1 | 5/2024 | Childress et al. |

OTHER PUBLICATIONS

Written Opinion for PCT/IB2021/061484 dated Feb. 23, 2022.
Rahman, N. et al: "Thickness dependence of magnetization dynamics of an in-plane anisotropy ferromagnet under a crossed spin torque polarizer", Journal of Magnetism and Magnetic Materials, May 8, 2017, pp. 95-100, vol. 439, Elsevier, Amsterdam, NL, XP085050054.
European Intention to Grant dated Mar. 6, 2025 for European Application No. 20315489.3; 7 Pages.
U.S. Appl. No. 18/161,145, filed Jan. 30, 2023, Jaiswal et al.
U.S. Appl. No. 18/294,283, filed Feb. 1, 2024, Timopheev et al.
U.S. Appl. No. 18/333,680, filed Jun. 13, 2023, Jaiswal.
U.S. Appl. No. 18/419,683, filed Jan. 23, 2024, Lassalle-Balier et al.
U.S. Appl. No. 18/428,150, filed Jan. 31, 2024, Gurcan et al.
U.S. Appl. No. 18/440,322, filed Feb. 13, 2024, Jaiswal et al.
U.S. Appl. No. 18/458,441, filed Aug. 30, 2023, Daigle et al.
U.S. Appl. No. 18/470,538, filed Sep. 20, 2023, Solignac et al.
U.S. Appl. No. 18/503,333, filed Nov. 7, 2023, Daigle et al.
U.S. Appl. No. 18/511,743, filed Nov. 16, 2023, Campiglio et al.
U.S. Appl. No. 18/606,125, filed Mar. 15, 2024, Lassalle-Balier et al.
U.S. Appl. No. 18/628,319, filed Apr. 5, 2024, Lehndorff et al.
U.S. Appl. No. 18/652,971, filed May 2, 2024, Campiglio et al.
U.S. Appl. No. 18/660,811, filed May 10, 2024, Strelkov et al.
U.S. Appl. No. 18/679,972, filed May 31, 2024, Ducruet.
U.S. Appl. No. 18/709,631, filed May 13, 2024, Strelkov et al.
U.S. Appl. No. 18/740,749, filed Jun. 12, 2024, Dounia et al.
Extended European Search Report (EESR) dated Jun. 2, 2021 for European Application No. 20315489.3; 8 Pages.
Response to Extended European Search Report dated Jun. 2, 2021 for European Application No. 20315489.3; Response filed Nov. 8, 2022; 37 Pages.
Japanese Voluntary Amendment (with English Translation from Espacenet.com) filed on Aug. 10, 2023 for Japanese Application No. 2023-535328; 7 Pages.
Korean Voluntary Amendment (with English Translation from Espacenet.com) filed on Jul. 13, 2023 for Korean Application No. 10-2023-7019328; 15 Pages.

* cited by examiner

MAGNETORESISTIVE ELEMENT FOR SENSING A MAGNETIC FIELD IN A Z-AXIS

CROSS-REFERENCE TO RELATED APPLICATIONS

This application is a national phase of PCT/IB2021/061484 filed on Dec. 9, 2021, which claims the priority of European Application No. 20315489.3, filed on Dec. 11, 2020. The entire contents of these applications are hereby incorporated by reference in their entireties.

TECHNICAL DOMAIN

The present invention concerns a magnetoresistive element comprising a sense layer, for measuring an external magnetic field along an axis substantially perpendicular to the plane of the sense layer. The present invention further concerns a method for operating the magnetoresistive element.

RELATED ART

Currently, magnetic sensors are widely used in cell phones and other mobile devices as electronic compass. For a two-dimensional magnetic field in an X-Y plane, measurement of the X and Y components of the magnetic field within the plane may be implemented by using two orthogonal sensors, but for the measurement on the magnetic field in a Z-axis direction there are many difficulties. The following solutions are typically utilized.

One solution includes a separate single-axis planar magnetoresistive sensor installed perpendicular to a two-axis planar sensor. This solution requires assembling two different sensors, the X-Y two-axis magnetoresistive sensor and the Z-axis magnetoresistive sensor.

Another solution includes a flux guide to convert a magnetic field from the Z-axis direction into magnetic field components in the X- and Y-axis directions. For example, document US2012206137 discloses a single-chip three-axis AMR sensor, which implements measurement of a magnetic field in the Z-axis direction by placing a flux guide above in-plane sensors. In such solution, the magnetic field in the Z-axis direction is not fully converted into the X- and Y-axis directions. In addition, such sensor design needs to use a specific algorithm for calculating the magnetic field in the Z-axis direction, which makes the sensor design more complicated.

Yet another solution includes micro-machining a substrate to form an inclined plane, onto which a sensor that partially senses the magnetic field in the Z-axis direction is deposited. Such a process is very complicated, has a low spatial efficiency, and may cause some shadowing effects in the deposition of the sensor, which may degrade the performance of the sensor.

Yet another solution includes using magnetic materials with perpendicular magnetic anisotropy for measuring the magnetic field in the Z-axis direction. For example, document US20130168787 discloses a magnetic sensor which measures a Z-axis component of an external magnetic field by using a perpendicular magnetic anisotropy material. The perpendicular magnetic anisotropy material has a high coercivity, and low magnetoresistance.

SUMMARY

The present disclosure concerns a magnetoresistive element comprising a reference layer having a fixed reference magnetization, a sense layer having a free sense magnetization and a tunnel barrier layer between the reference and sense layers. The magnetoresistive element is configured to measure an external magnetic field oriented substantially perpendicular to the plane of the layers. The reference magnetization is oriented substantially perpendicular to the plane of the reference layer. The sense magnetization comprising a vortex configuration in the absence of an external magnetic field. The vortex configuration is substantially parallel to the plane of the sense layer and has a vortex core magnetization direction along an out-of-plane axis substantially perpendicular to the plane of the sense layer.

In one aspect, the sense layer has a thickness that is greater than 60 nm, and wherein the sense layer comprises a first soft ferromagnetic material having a sense magnetization between 300-600 kA/m.

The present disclosure further concerns a method for operating the magnetoresistive element, comprising:
  selecting the direction of the a vortex core by applying an initialization magnetic field until the vortex expulsion field is reached and reducing the initialization magnetic field below a nucleation field at which vortex re-forms; wherein the vortex core magnetization direction is determined by the polarity of the vortex expulsion field and the nucleation field; and
  measuring an external magnetic field.

The magnetoresistive element disclosed herein can measure an external magnetic field along an out-of-plane axis substantially perpendicular to the plane of the sense layer. The vortex configuration of the magnetoresistive element can have an expulsion field greater than 200 mT or 250 mT.

The magnetoresistive element has low hysteresis, less than 300 µV/V for external magnetic field magnitudes up to the expulsion field, and high linearity, i.e., less than 2% or 1% error.

SHORT DESCRIPTION OF THE DRAWINGS

Exemplar embodiments of the invention are disclosed in the description and illustrated by the drawings in which.

EXAMPLES OF EMBODIMENTS

Figure 1:
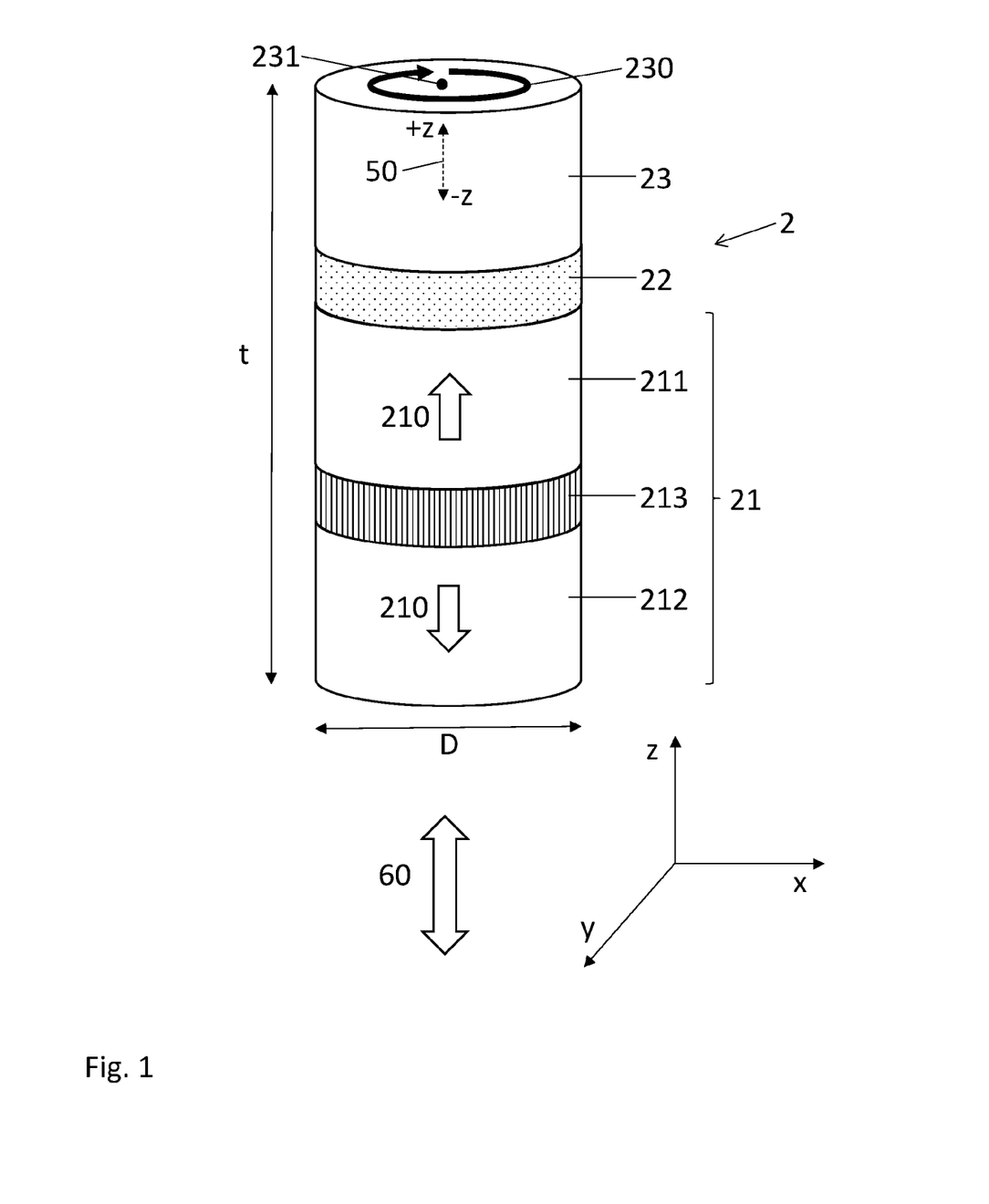
FIG. 1 illustrates a magnetoresistive element, according to an embodiment.

FIG. 1 illustrates a magnetoresistive element 2, according to an embodiment. The magnetoresistive element comprises a reference layer 21 having a fixed reference magnetization 210, a sense layer 23 having a free sense magnetization 230 and a tunnel barrier layer 22 between the reference layer 21 and the sense layer 23. The sense magnetization 230 comprises a vortex configuration substantially parallel to the plane of the sense layer 23 in the absence of an external magnetic field 60. The reference layer 21 can have perpendicular magnetic anisotropy (PMA) such that the reference magnetization 210 is oriented substantially perpendicular to the plane of the reference layer 21.

The magnetoresistive element 2 can measure an external magnetic field 60 being oriented substantially perpendicular to the plane of the reference and sense layers 21, 23.

The sense layer 23 has a sense magnetization 230 direction distribution with a vortex configuration, whereby the vortex magnetization curls in a circular path along the edge of the sense layer 23 and around a vortex core 231. The vortex magnetization direction may be arranged in a clockwise direction and may also be arranged in a counterclockwise direction. During normal sensor operation, the magnetization of the vortex core 231 can vary in accordance to the external magnetic field 60 in a direction substantially perpendicular to the plane of the sense layer 23 (or direction ±z). Referring to FIG. 1, the magnetization of the vortex core 231 can be oriented in an upward direction (i.e., toward the direction +z) or in a downward direction (i.e., toward an opposite direction −z). The size of the vortex core increases or decreases in the direction +z or −z ( ) when the magnitude of the external magnetic field 60 increases or decreases, respectively. However, during normal sensor operation the vortex core magnetization direction ±z, or vortex core magnetization polarity, is fixed.

The vortex configuration provides a linear and non-hysteretic behavior in a large magnitude range of the external magnetic field 60, for practical size of the magnetoresistive element 2 and thickness of the sense layer 23. The linear and non-hysteretic portion of the magnetization curve facilitates the measurement of small variations of the external magnetic field 60. The vortex configuration is thus advantageous for magnetic sensor applications.

Figure 2:
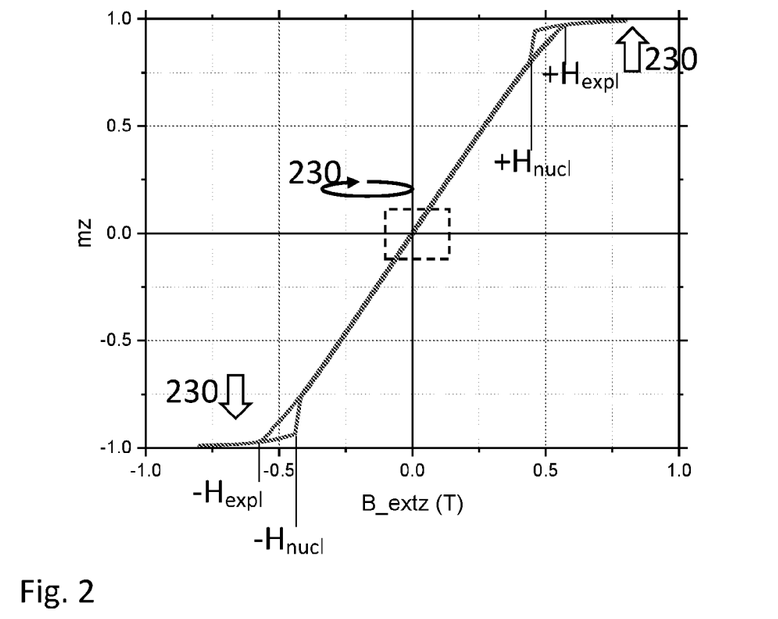
FIG. 2 shows a magnetization curve of the magnetoresistive element.

FIG. 2 shows a magnetization curve (or hysteresis response) of the magnetoresistive element 2 as a function of the external magnetic field 60 (indicated by the symbol $B_{extz}$). Here, "mz" corresponds to the averaged component along direction ±z of the sense magnetization (<Mz> or z-component of the sense magnetization Ms), normalized to the sense magnetization Ms (mz=<Mz>/Ms). In the case of a vortex configuration, the magnetization curve is characterized by a linear increase of the vortex core magnetization with the external magnetic field $B_{extz}$ until the vortex expulsion field is reached at the $H_{expl}$ point. At this point the sense magnetization 230 becomes magnetically saturated (represented by the arrow pointing upwards (the direction +z). The vortex state in the sensing layer 23 is recovered when the external magnetic field $B_{extz}$ is reduced below a nucleation field $H_{nucl}$. When the external magnetic field $B_{extz}$ is decreased until the vortex expulsion field is reached at the $H_{expl}$ point (negative external magnetic field $B_{ext}$) the sense magnetization 230 becomes magnetically saturated (represented by the arrow pointing downwards (the direction −z). The nucleation field $H_{nucl}$ is the field at which vortex re-forms after vortex expulsion. As long as the magnitude of the external magnetic field $B_{extz}$ is below the absolute value corresponding to the expulsion field (+/−$H_{expl}$), the magnetization curve comprises a reversible linear portion corresponding to the variation of the vortex core 231 magnetization with the external magnetic field 60. The vortex core magnetization polarity can be reversed (between direction z and −z) when the expulsion field $H_{expl}$ is exceeded.

Figure 3:
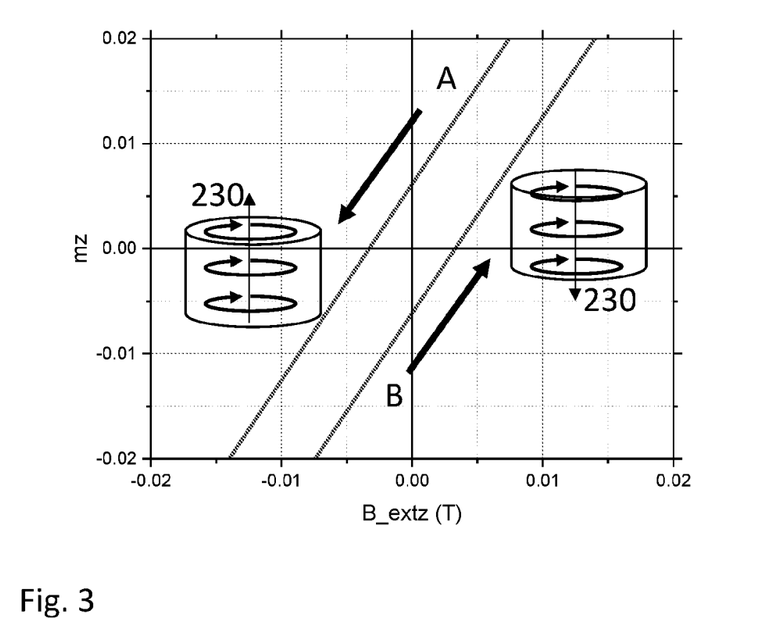
FIG. 3 shows an enlarged view of a portion of the reversible linear portion of the magnetization curve of FIG. 2.

FIG. 3 shows an enlarged view of a portion of the reversible linear portion of the magnetization curve of FIG. 2. The magnetization curve to the external magnetic field $B_{extz}$ is shifted towards higher magnetization values when the external magnetic field $B_{extz}$ is decreased from the nucleation field $H_{nucl}$, compared to when the external magnetic field $B_{extz}$ is increased from the nucleation field $H_{nucl}$. In other words, the reversible linear portion of the magnetization curve exhibits a hysteresis due to the different vortex core magnetization polarity, that is the direction of the vortex core 231 magnetization.

The vortex core magnetization polarity depends on the nucleation field +/−$H_{nucl}$ at which the vortex re-forms after vortex expulsion. It is then possible to operate the magnetoresistive element 2 in only one of the branch of the magnetization curve, for example the branch A (see FIG. 3) when the field is swept back to negative from the positive nucleation field +$H_{nucl}$ (and the positive vortex expulsion field +$H_{expl}$) or the branch B when the field is swept back to positive from the negative nucleation field −$H_{nucl}$ (and the negative vortex expulsion field −$H_{expl}$).

A method for operating the magnetoresistive element 2 can comprise the steps of selecting the direction z or −z of the vortex core magnetization (vortex core magnetization polarity) by applying an initialization magnetic field to the magnetoresistive element 2 until the vortex expulsion field $H_{expl}$ is reached and then, reducing the initialization magnetic field below the nucleation field $H_{nucl}$ at which the vortex re-forms. The vortex core magnetization polarity is determined by the polarity of the vortex expulsion field $H_{expl}$ and the nucleation field $H_{nucl}$. The method further comprises the step of measuring an external magnetic field 60.

After applying an initialization magnetic field, the method can further comprise a step of programming the magnetoresistive element 2 to program the orientation of the reference magnetization 210. The programming step can be performed by applying a programming magnetic field adapted to orient the reference magnetization 210. The programming step can further comprise heating the magnetoresistive element 2 to a temperature where the orientation of the reference magnetization 210 is facilitated, for example at a temperature where the reference magnetization 210 is unpinned. Heating the magnetoresistive element 2 can be performed by using resistive heating or laser heating. During the programming step, the vortex core magnetization polarity can be considered fixed.

It should be noted that the operation of the magnetoresistive element 2 is not limited to any specific portion of the branches A or B shown in FIG. 3. Indeed, the magnetoresistive element 2 can be operated anywhere in the linear region of branch A or branch B (the latter with a vortex magnetization polarity reversed relative to the one in branch A).

In any case, the magnetoresistive element 2 should measure the external magnetic field 60 below the vortex expulsion field $+/-H_{expl}$. The vortex magnetization polarity is fixed during sensor operation and is independent of vortex chirality (clockwise or counterclockwise).

The obtention of a vortex configuration in the sense layer 23 depends on a number of factors, including materials properties of the sense layer 23. Generally, the vortex configuration is favored at zero applied field by increasing the aspect ratio of the thickness on the diameter of the sense layer 23. The aspect ratio is still typically much less than 1 (for example 0.01 to 0.5). Moreover, the values and the slope of the linear part of the magnetization curve of FIG. 2 are strongly dependent on the size of the sense layer 23.

In particular, the vortex configuration can be characterized by its susceptibility x, which corresponds to the slope of the linear region of the magnetization curve:

$$\chi = \partial M / \partial H_{ext} \quad (1).$$

The sensitivity S of the magnetoresistive element 2 is then proportional to the product between the susceptibility $\chi$ and the tunnel magnetoresistance (TMR) of the magnetoresistive sensor element 2:

$$S = \chi * TMR \quad (2).$$

Figure 4:
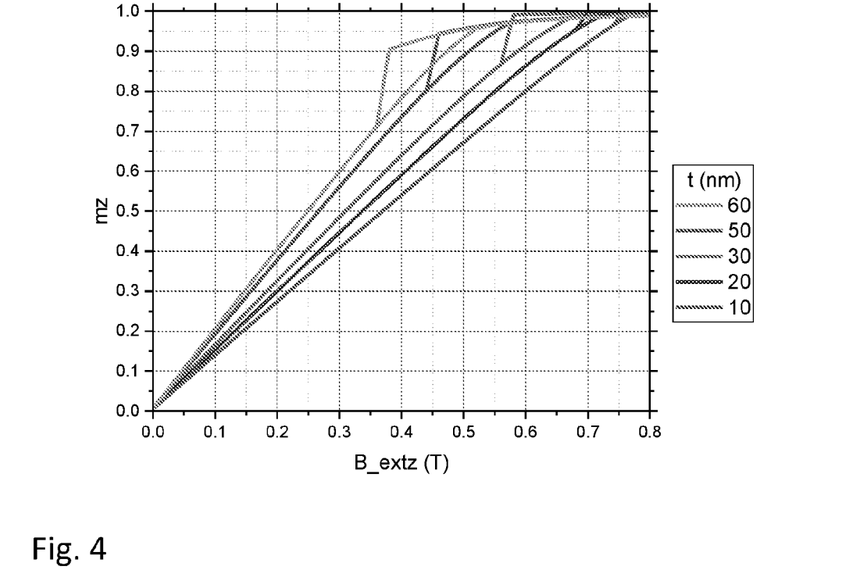
FIG. 4 report magnetization curves for several thickness of the sense layer and for the magnetoresistive element having a lateral dimension of 250 nanometer (nm)

FIG. 4 reports magnetization curves to the z-aligned external magnetic field $B_{extz}$ on the magnetization of the sense layer 23, for several thickness of the sense layer 23, namely for thicknesses of the sense layer 23 between 10 nm and 60 nm. The magnetoresistive element 2 has a lateral dimension D of about 250 nm. FIG. 4 shows an increase in the slope of the magnetization curve, and thus the susceptibility x, with increasing thickness of the sense layer 23. For a given TMR value, increasing the thicknesses of the sense layer 23 results in an increase of the sensitivity S of the magnetoresistive element 2. This is in contrast to the case of a vortex configuration in the plane of the sense layer 23 and having a vortex core magnetization that is reversibly movable substantially parallel to the plane of the sense layer 23.

Figure 5:
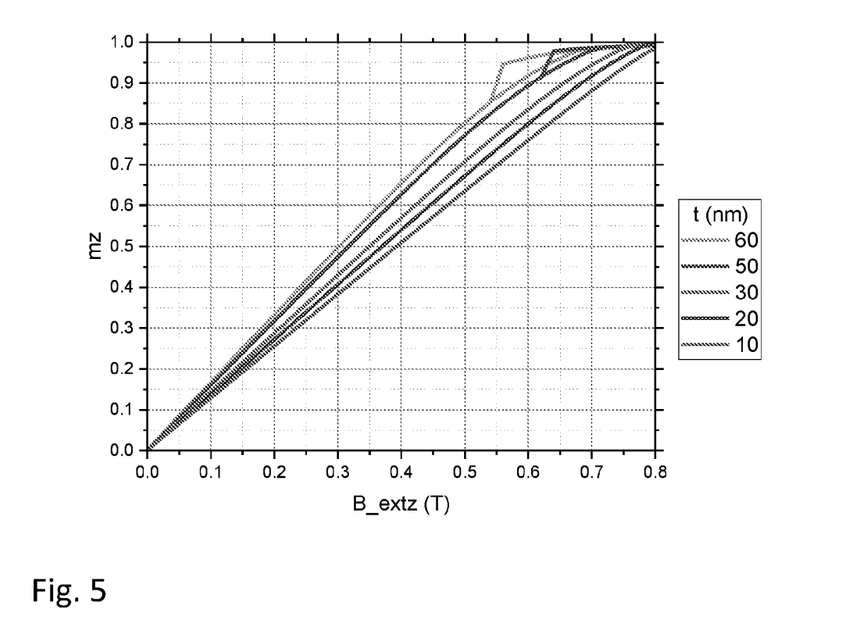
FIG. 5 report magnetization curves for several thickness of the sense layer and for the magnetoresistive element having a lateral dimension of 450 nm.

FIG. 5 reports magnetization curves to the z-aligned external magnetic field $B_{extz}$ of the sense layer 23 for several thickness of the sense layer 23, namely for thicknesses of the sense layer 23 between 10 nm and 60 nm. The magnetoresistive element 2 has a lateral dimension of about 450 nm. FIGS. 4 and 5 show that the susceptibility $\chi$ increases, and for a given TMR value the sensitivity S of the magnetoresistive element 2 increases, with decreasing smaller lateral dimension D of the magnetoresistive element 2. For given thicknesses of the layers 21, 23, the value the sensitivity S increases with increasing the aspect ratio t/D of the thickness t to the diameter (lateral dimension) D of the magnetoresistive element 2.

Figure 6:
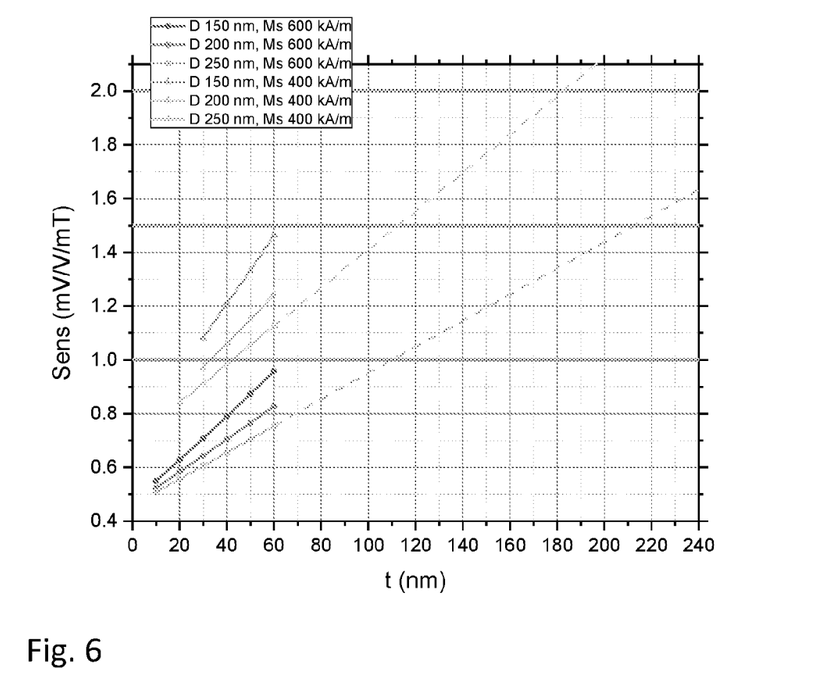
FIG. 6 reports the sensitivity of the magnetoresistive element as a function of the thickness of the sense layer.

The sensitivity S of the magnetoresistive element 2 is plotted as a function of the thickness of the sense layer 23 in FIG. 6. The sensitivity S was simulated for lateral dimensions D of the magnetoresistive element 2 of 150 nm, 200 nm and 250 nm, and for magnetizations of the sense layer 23 of 400 and 600 kA/m. The TMR value of the magnetoresistive element 2 was assumed to be 100%. FIG. 6 shows that the higher values of sensitivity S are obtained for a lateral dimension of 150 nm and a magnetization of 400 kA/m. For a given TMR value, decreasing the sense magnetization 230 of the sense layer 23 results in an increase of the sensitivity S of the magnetoresistive element 2. In the whole text of this application, the expression "sense magnetization" is used indifferently for "saturation sense magnetization" or "spontaneous sense magnetization", where saturation magnetization has its usual meaning of the maximum induced magnetic moment.

In term of design rules for the magnetoresistive element 2 that can measure an external magnetic field along an out-of-plane axis substantially perpendicular to the plane of the sense layer and having high working field range, low hysteresis, high linearity and sufficient sensitivity, the results shown above suggest providing the magnetoresistive element 2 where the reference layer 21 has a reference magnetization 210 oriented substantially perpendicular to the plane of the reference layer 21, and where the sense layer 23 has a sense magnetization 230 comprising a vortex configuration in the absence of an external magnetic field 60. The vortex configuration should be substantially parallel to the plane of the sense layer 23 and have a vortex core 231 magnetization along an out-of-plane axis 50 substantially perpendicular to the plane of the sense layer 23.

Moreover, in term of design rules for the magnetoresistive element 2 having high working field range (such as 60 mT or more), low hysteresis (such as less than 300 µV/V) for external magnetic field magnitudes up to the expulsion field, high linearity (such as less than 2% or 1% error) and sufficient sensitivity, the magnetoresistive element 2 should have small lateral dimension D (or high aspect ratio), for example a lateral dimension D below 450 nm, or below 300 nm, preferably below 250 nm, or preferably below 150 nm, and a small sense magnetization 230 of the sense layer 23, for example a sense magnetization below 850 kA/m, possibly below 600 kA/m or possibly below 400 kA/M. Advantageously, the sense layer 23 has a thickness of that is greater than 50 nm or preferably greater than 100 nm.

In one aspect, the thickness of the sense layer 23 can be thick (more than 50 nm) and the sense magnetization 230 of the sense layer 23 can have value that is corresponds to typical saturation magnetization values found in conventional magnetoresistive elements (for example 600 kA/m or larger). In a first example (FIG. 7), the magnetoresistive element 2 has a lateral dimension D of 250 nm and the sense layer 23 has a thickness of 110 nm. The ferromagnetic material forming the sense layer 23 can comprise a ferromagnetic alloy having a sense magnetization 230 of 600 kA/m or larger (here 600 kA/m).

Preferably, the ferromagnetic material forming the sense layer 23 comprises, or is made of, a first soft ferromagnetic material having a sense magnetization 230 between 300-600 kA/m. The sense magnetization 230 between 300-600 kA/m allows for increasing the perpendicular sensitivity of the magnetoresistive element.

In a preferred embodiment, the sense layer 23 has a thickness that is greater than 60 nm, or greater than 70 nm, or greater than 80 nm.

In another aspect, the low sense magnetization of the sense layer 23 can be obtained by decreasing the thickness (for example below 50 nm) and/or by a proper selection of the ferromagnetic material forming the sense layer 23 such as to obtain a low sense magnetization (for example lower than 600 kA/m). In a second example (FIG. 8), the magnetoresistive element 2 has a lateral dimension D of 250 nm, the sense layer 23 has a thickness of 46 nm and has a sense magnetization of 400 kA/m. The sense layer 23 can be formed a ferromagnetic alloy having a low magnetization.

Figure 7:
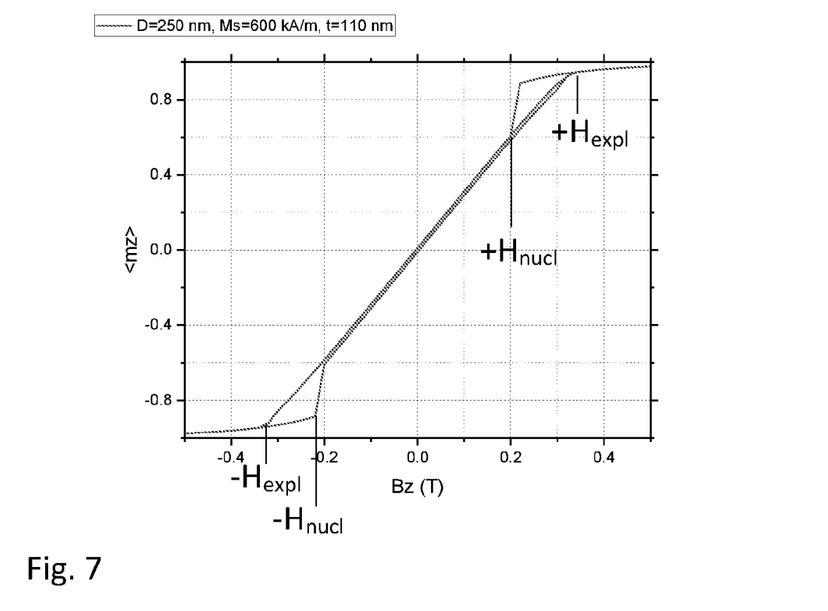
FIG. 7 shows the magnetization curve for the magnetoresistive element having a lateral dimension of 250 nm, a sense layer having a thickness of 110 nm and a magnetic moment of 600 kiloamperes per meter (kA/m)
Figure 8:
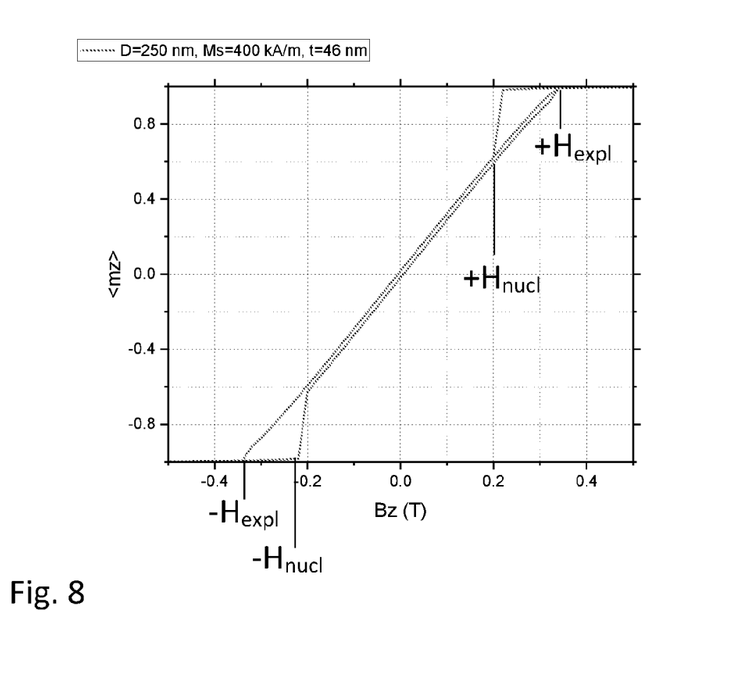
FIG. 8 shows the magnetization curve for the magnetoresistive element having a lateral dimension of 250 nm, a sense layer having a thickness of 46 nm and a magnetic moment of 400 kA/m.

FIGS. 7 and 8 show that a substantially identical magnetization curve is obtained for the magnetoresistive element 2 of the first and second examples. In both examples, the expulsion field $H_{expl}$ can be about 300 mT and the nucleation field $H_{nucl}$ can be about 200 mT.

The magnetoresistive element 2 can have a sensitivity S of 1 mV/V or higher, for TMR=100%. The sensitivity S can be further increased by increasing TMR.

Referring again to FIG. 1, the reference layer 21 can comprise a synthetic antiferromagnetic (SAF) structure including a first reference sublayer 211 in contact with the tunnel barrier layer 22 and a second reference sublayer 212 separated from the first reference sublayer 211 by a coupling layer 213, wherein the coupling layer 213 antiferromagnetically couple the first reference sublayer 211 to the second reference sublayer 212. Each of the first and second reference sublayer 211, 212 has PMA such that a reference magnetization 210 is oriented substantially perpendicular to the plane of the first and second reference sublayer 211, 212 and in opposite directions.

Figure 9:
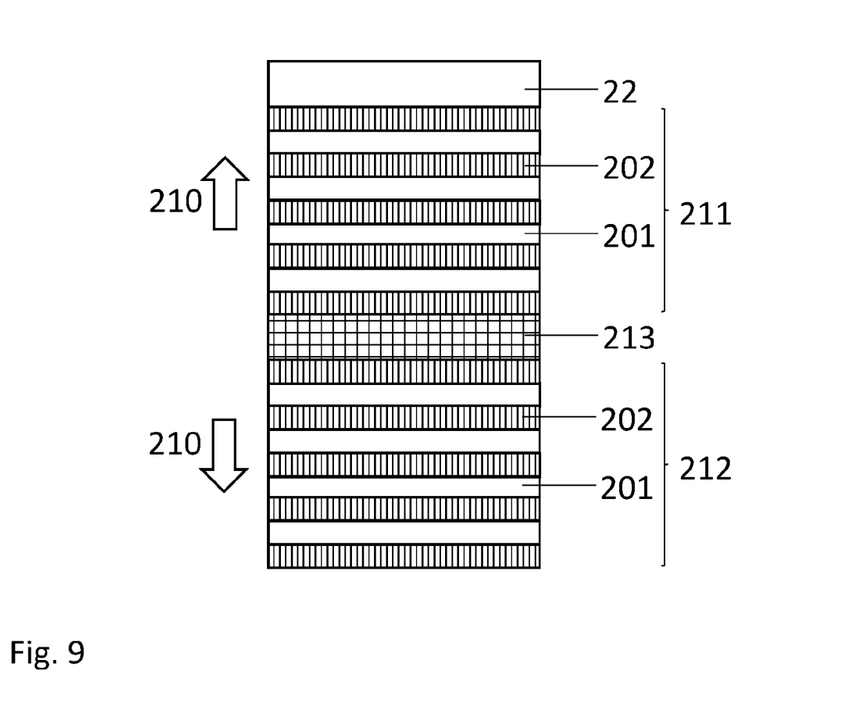
FIG. 9 illustrates a reference layer of the magnetoresistive element, according to an embodiment.

In an embodiment represented in FIG. 9, each of the first and second reference sublayer 211, 212 includes a multilayer structure. In particular, each of the first and second reference sublayer 211, 212 can include a plurality of alternating first metallic layers 201 and second metallic layers 202. For example, the first metallic layer 201 can comprise an ultrathin Co layer and the second metallic layer 202 can comprise an ultrathin Pt layer. Although the second metallic layer 202 preferably comprises Pt, other metals that provide PMA can also be used.

In one aspect, the ultrathin Co layer 201 can have a thickness between 0.4 nm and 0.6 nm. The ultrathin Pt layer 202 can have a thickness between 0.2 nm and 0.4 nm. The coupling layer 213 can be a Ru layer. Although the coupling layer 213 preferably comprises Ru, other metals that generate RKKY coupling can also be used.

The reference layer 21 comprising the SAF structure according to the configuration of FIG. 9 can achieve a field stability of greater than 300 mT to 400 mT.

Figure 10:
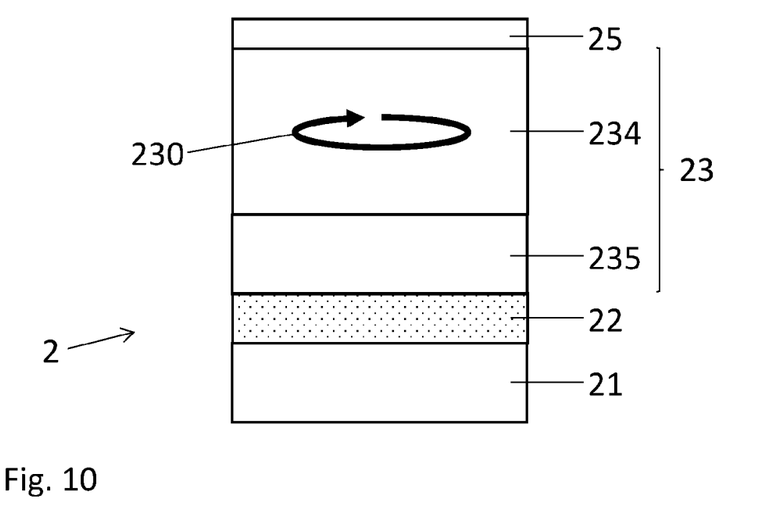
FIG. 10 illustrates the magnetoresistive element comprising a first and second sense layers, according to an embodiment.

In another embodiment shown in FIG. 10, the sense layer 23 comprises a first sense layer 234 and a second sense layer 235, between the first sense layer 234 and the tunnel barrier layer 22 and in contact with the latter. The magnetoresistive element 2 can further comprise at least a cap layer 25 on top of the first sense layer 234. The second sense layer 235 has a thickness between 1 nm and 5 nm. The total thickness of the second sense layer 235 and the first sense layer 234 is greater than 60 nm, such that the sense layer 23 has a thickness greater than 60 nm, as described above. The first sense layer 234 comprises, or is made of, a first soft ferromagnetic material. The second sense layer 235 comprises, or is made of, a second soft ferromagnetic material.

Figure 11:
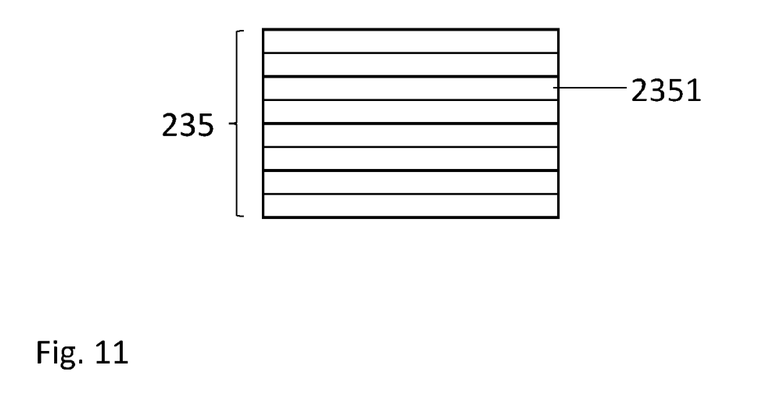
FIG. 11 shows the second sense layer comprising a plurality of second ferromagnetic sublayers, according to an embodiment.

The second sense layer 235 can comprise a single layer containing a second soft ferromagnetic material. Alternatively, the second sense layer 235 can comprise a plurality of second ferromagnetic sublayers 2351, each ferromagnetic sublayer containing a second soft ferromagnetic material (see FIG. 11). Each sublayer can have a thickness between 0.5 nm and 3 nm.

The second soft ferromagnetic material can comprise a CoFeB (Cobalt-Iron-Boron) alloy. In particular, the second soft ferromagnetic material can comprise a CoFeB alloy where Co=20-80 at %, Fe=20-80 at %, and B=0-30 at %.

Figure 12:
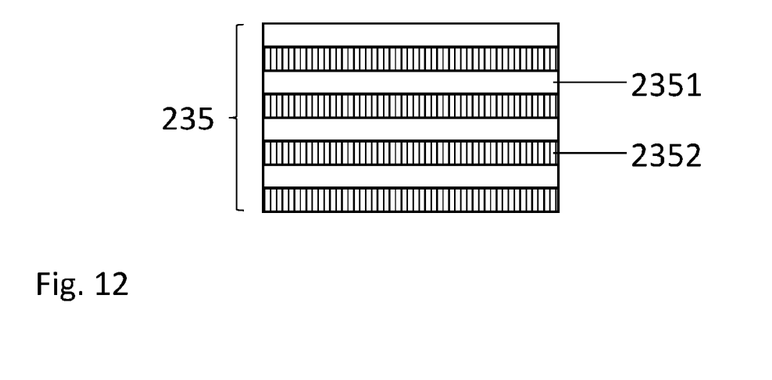
FIG. 12 shows the second sense layer comprising the plurality of second ferromagnetic sublayers and second insertion sublayers, according to an embodiment.

In another alternative illustrated in FIG. 12, the second sense layer 235 comprises the plurality of second ferromagnetic sublayers 2351 and a second insertion sublayer 2352 of Ta (Tantalum), W (Tungsten) or Ti (Titanium) comprised between adjacent second ferromagnetic sublayers 2351. The second insertion sublayer 2352 can have a thickness between 0.1 nm and 0.5 nm.

Figure 13:
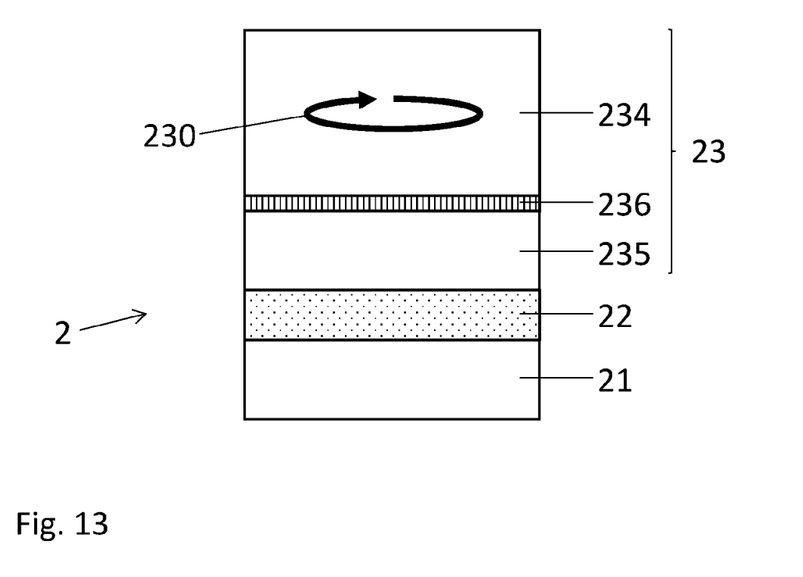
FIG. 13 illustrates the magnetoresistive element comprising a first and second sense layers, according to another embodiment.

In yet another alternative shown in FIG. 13, the sense layer 23 can comprise an insertion layer 236 of Ta, W or Ti and of thickness between 0.1 nm and 0.5 nm, between the second sense layer 235 and the first sense layer 234.

The first sense layer 234 is configured to such that the sense magnetization 230 comprises a vortex configuration substantially parallel to the plane of the sense layer 23 in the absence of an external magnetic field 60. The first sense layer 234 can comprise, or be made of, a first soft ferromagnetic material.

Figure 14:
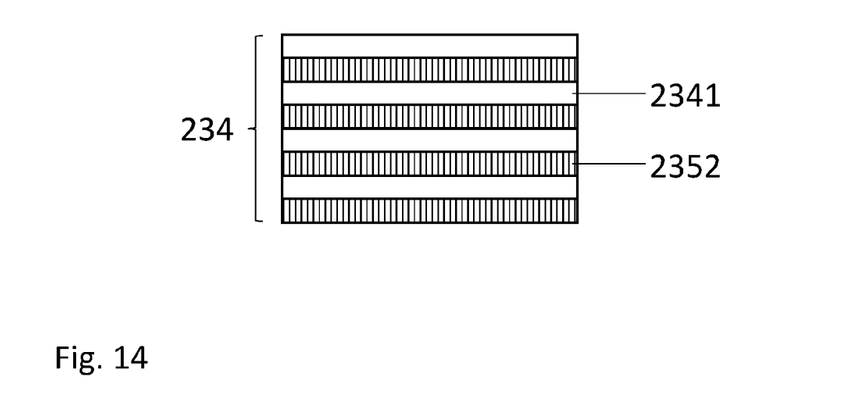
FIG. 14 shows the first sense layer comprising a plurality of first ferromagnetic sublayers, according to an embodiment.

Alternatively, the first sense layer 234 can comprises a plurality of first ferromagnetic sublayers 2341 (see FIG. 14). Each first ferromagnetic sublayer 2341 can comprise, or being made of, a first soft ferromagnetic material and be between 0.5 nm and 3 nm in thickness. Each first ferromagnetic sublayer 2341 can be separated by a first insertion sublayer 2342 comprising Ta, Ti, W or Ru (Ruthenium) and having a thickness between 0.05 nm and 0.2 nm.

The first and second soft ferromagnetic materials can be selected such that the sense layer 23 has having a sense magnetization 230 equal or smaller than 600 kA/m, or between 300-600 kA/m.

The first soft ferromagnetic material can comprise an alloy of Ni (Nickel), Fe (Iron) and/or Co (Cobalt), such as Ni80Fe20 at %.

In one aspect, the first soft ferromagnetic material contains between 1 at % and 30 at % of one of: Ta, Ti, W or Ru. Alloying with Ta, Ti, W or Ru helps in achieving the low sense magnetization 230, equal or smaller than 600 kA/m, or between 300-600 kA/m.

REFERENCE NUMBERS AND SYMBOLS 2 magnetoresistive element
21 reference layer
201 first metallic layer
202 second metallic layer
210 reference magnetization
211 first reference sublayer
212 second reference sublayer
213 coupling layer
22 tunnel barrier layer
23 sense layer
230, Ms sense magnetization
231 vortex core
234 first sense layer
2341 first ferromagnetic sublayer
2342 first insertion sublayer
235 second sense layer
2351 second ferromagnetic sublayer
2352 second insertion sublayer
236 insertion layer
25 cap layer
50 out-of-plane axis
60 external magnetic field
A, B branch of the magnetization curve
$B_{ext}$ external magnetic field along direction z
D lateral dimension, diameter
$H_{expl}$ expulsion field
$H_{nucl}$ nucleation field
mz magnetization
t thickness

The invention claimed is:

1. Magnetoresistive element comprising:
   a reference layer having a fixed reference magnetization, a sense layer having a free sense magnetization and a tunnel barrier layer between the reference layer and the sense layer;
   the magnetoresistive element being configured to measure an external magnetic field oriented substantially perpendicular to the plane of the layers;
   wherein the reference magnetization is oriented substantially perpendicular to the plane of the reference layer; and
   wherein the sense magnetization comprises a vortex configuration in the absence of an external magnetic field, the vortex configuration being substantially parallel to the plane of the sense layer and having a vortex core magnetization along an out-of-plane axis substantially perpendicular to the plane of the sense layer;
   wherein the sense layer has a thickness that is greater than 60 nm, and
   wherein the sense layer comprises a first soft ferromagnetic material having a sense magnetization between 300-600 kA/m (kiloamperes per meter).

2. Magnetoresistive element according to claim 1, having a lateral dimension being smaller than 450 nm (nanometer), and preferably smaller than 300 nm, 250 nm.

3. Magnetoresistive element according to claim 1, wherein the sense layer has a thickness being greater than 80 nm or greater than 100 nm.

4. Magnetoresistive element according to claim 1, wherein the sense magnetization is between 300-600 kA/m at room temperature.

5. Magnetoresistive element according to claim 1, wherein the sense layer comprises a first sense layer comprising a first soft ferromagnetic material and a second sense layer comprising a second soft ferromagnetic material, the second sense layer being between the first sense layer and the tunnel barrier layer and in contact with the latter.

6. Magnetoresistive element according to claim 5, wherein second sense layer comprises a single layer having a thickness between 1 nm and 5 nm.

7. Magnetoresistive element according to claim 5, wherein the second sense layer comprises a plurality of ferromagnetic sublayers, each ferromagnetic sublayers having a thickness between 0.5 nm and 3 nm.

8. Magnetoresistive element according to claim 6, wherein the second soft ferromagnetic material comprises a CoFeB (Cobalt-Iron-Boron) or a NiFeB (Nickel-Iron-Boron) alloy.

9. Magnetoresistive element according to claim 8, wherein the CoFeB alloy comprises Co=20-80 at %, Fe=20-80 at %, and B=0-30 at %.

10. Magnetoresistive element according to claim 7, wherein the second sense layer further comprises an insertion sublayer of Ta, W or Ti comprised between adjacent ferromagnetic sublayers, the insertion sublayer having a thickness between 0.1 nm and 0.5 nm.

11. Magnetoresistive element according to claim 5, wherein the sense layer comprises an insertion layer of Ta (Tantalum), W (Tungsten) or Ti (Titanium) and of thickness between 0.1 nm and 0.5 nm, between the second sense layer and the first sense layer.

12. Magnetoresistive element according to claim 5,
    wherein the first sense layer comprises a plurality of first ferromagnetic sublayers, each first ferromagnetic sublayer being between 0.5 nm and 3 nm in thickness; and
    wherein the first ferromagnetic sublayers are separated by a first insertion sublayer comprising Ta, Ti, W or Ru (Ruthenium) and having a thickness between 0.05 nm and 0.2 nm.

13. Magnetoresistive element according to claim 4, wherein the first soft ferromagnetic material comprises an alloy of Ni (Nickel), Fe (Iron) and/or Co (Cobalt).

14. Magnetoresistive element according to claim 13, wherein the alloy comprises Ni80Fe20 at %.

15. Magnetoresistive element according to claim 4, wherein the first soft ferromagnetic material contains between 0 at % and 30 at % of one of: Ta, Ti, W or Ru.

16. Magnetoresistive element according to claim 1, wherein the reference layer comprises a synthetic antiferromagnetic (SAF) structure including a first reference sublayer in contact with the tunnel barrier layer and a second reference sublayer separated from the first reference sublayer by a coupling layer antiferromagnetically coupling the first reference sublayer to the second reference sublayer.

17. Magnetoresistive element according to claim 16, wherein each of the first and second reference sublayer comprises a plurality of alternating first metallic layers and second metallic layers.

18. Magnetoresistive element according to claim 17, wherein the first metallic layer has a thickness between 0.4 nm and 0.6 nm and the second metallic layer has a thickness between 0.2 nm and 0.4 nm and the second metallic layer.

19. Method for operating the magnetoresistive element according to claim 1, comprising:
    selecting the direction of the vortex core magnetization by applying an initialization magnetic field until a vortex expulsion field is reached and reducing the initialization magnetic field below a nucleation field at which vortex re-forms; wherein the vortex core direction is determined by the polarity of the vortex expulsion field and the nucleation field; and
    measuring an external magnetic field.

20. Method according to claim 19, wherein said measuring an external magnetic field is performed for external magnetic field below the vortex expulsion field.

* * * * *